(12) United States Patent
Shibata et al.

(10) Patent No.: US 8,416,629 B2
(45) Date of Patent: *Apr. 9, 2013

(54) SEMICONDUCTOR STORAGE DEVICE ADAPTED TO PREVENT ERRONEOUS WRITING TO NON-SELECTED MEMORY CELLS

(75) Inventors: Noboru Shibata, Kawasaki (JP); Kenri Nakai, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/400,930

(22) Filed: Feb. 21, 2012

(65) Prior Publication Data

US 2012/0147670 A1 Jun. 14, 2012

Related U.S. Application Data

(63) Continuation of application No. 12/505,793, filed on Jul. 20, 2009, now Pat. No. 8,149,629.

(30) Foreign Application Priority Data

Nov. 12, 2008 (JP) ................................. 2008-290225

(51) Int. Cl.
*G11C 16/04* (2006.01)
(52) U.S. Cl. ............................. 365/185.27; 365/185.28
(58) Field of Classification Search ............. 365/185.27, 365/185.28, 185.03, 185.18
See application file for complete search history.

(56) References Cited

U.S. PATENT DOCUMENTS

| 6,125,053 | A | 9/2000 | Diorio et al. |
| 7,294,880 | B2 | 11/2007 | Osabe et al. |
| 7,411,834 | B2 * | 8/2008 | Kusakabe et al. ........ 365/185.23 |
| 2005/0052939 | A1 | 3/2005 | Osabe et al. |

FOREIGN PATENT DOCUMENTS

| JP | 6-112443 | 4/1994 |
| JP | 7-130888 | 5/1995 |
| JP | 10-223866 | 8/1998 |
| JP | 11-96778 | 4/1999 |
| JP | 11-284153 | 10/1999 |
| JP | 2001-84800 | 3/2001 |
| JP | 2001-230391 | 8/2001 |
| JP | 2002-245785 | 8/2002 |
| JP | 2004-192789 | 7/2004 |
| JP | 2007-506207 | 3/2007 |
| JP | 2008-204545 | 9/2008 |

OTHER PUBLICATIONS

Japanese Office Action issued Aug. 7, 2012, in Japan Patent Application No. 2008-290225 (with English Translation).

* cited by examiner

*Primary Examiner* — Vu Le
(74) *Attorney, Agent, or Firm* — Oblon, Spivak, McClelland, Maier & Neustadt, L.L.P.

(57) ABSTRACT

A memory cell array has a number of memory cells which are connected to word lines and bit lines and are arranged in a matrix form, each of the memory cells storing one of n levels (n is a natural number of 2 or more). A control circuit controls the potentials on the word lines and the bit lines in accordance with input data to write data to the memory cells. The control circuit is adapted to, at the write time, first apply a first potential to a well region or substrate in which the memory cells are formed, then set the well region or substrate to a second potential lower than the first potential, and next apply a predetermined voltage to the word lines to thereby perform a write operation.

8 Claims, 19 Drawing Sheets

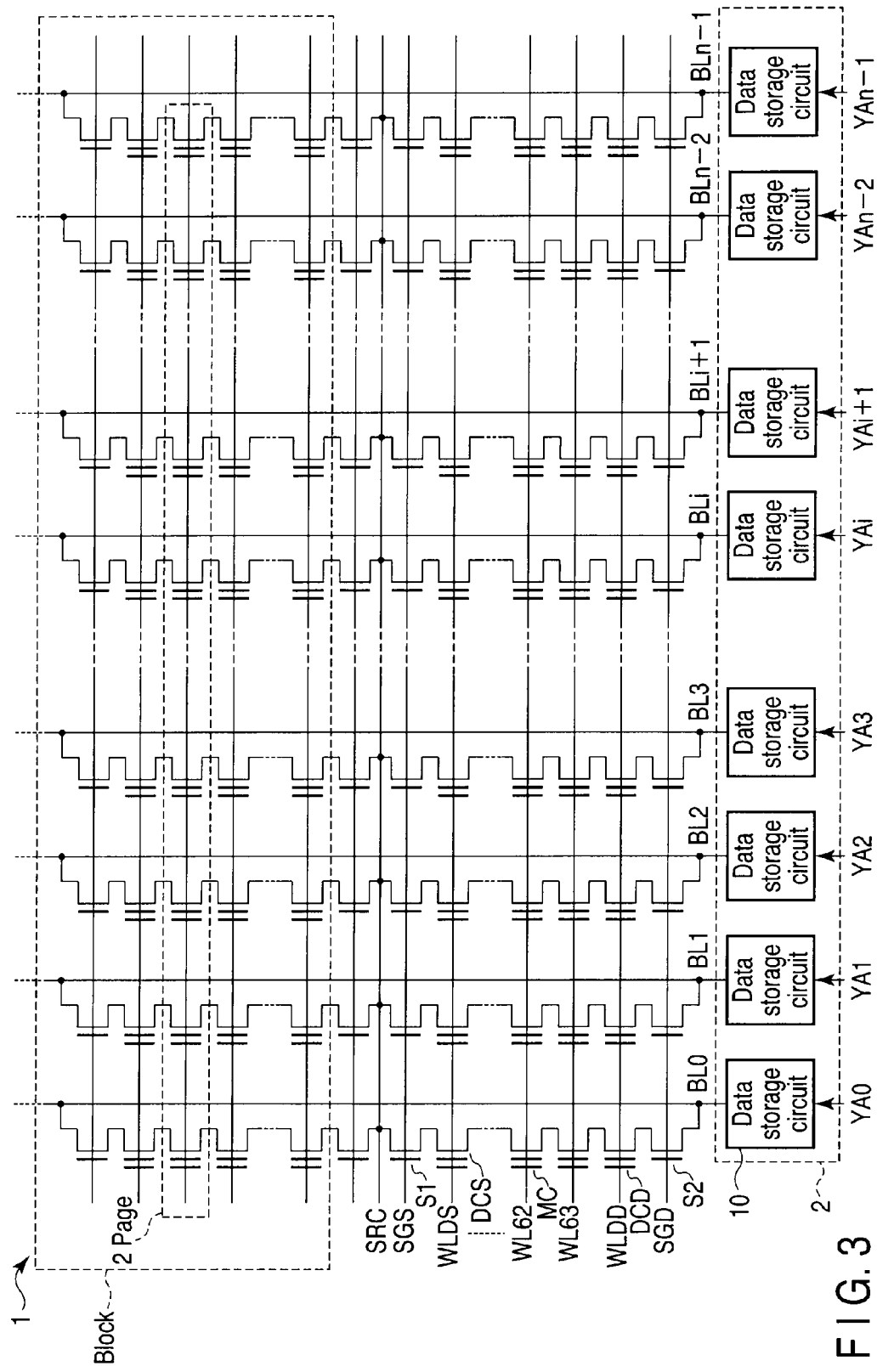
F I G. 3

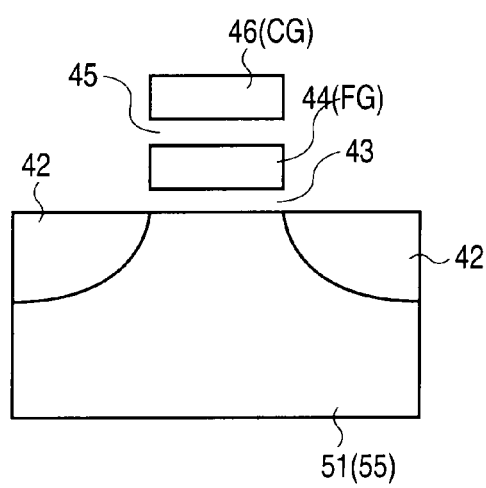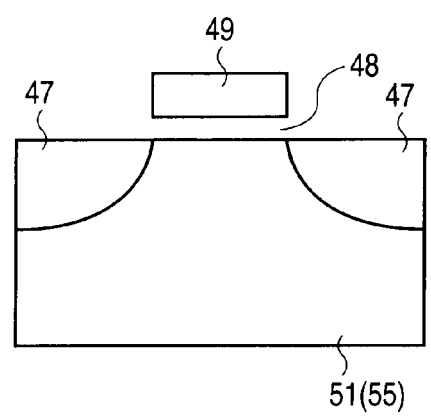
F I G. 4A　　　　　　　　F I G. 4B

| | Cell (P-Well) | Cell (N-Well) | H.V.Tr (P-sub) | L.V.Nch(P-well) | L.V.Pch (N-well) | H.V.Pch (N-well) |
|---|---|---|---|---|---|---|
| Erase | Vera (20V) | Vera (20V) | Vss (0V) | Vss (0V) | Vdd (2.5V) | Vdd (2.5V) |
| Program (well or substrate voltage boost) | Vdd (V)x | Vdd (V)x | Vss (0V) | Vss (0V) | Vdd (2.5V) | Vdd (2.5V)/ Vpgm H or Vpgm or Vpass |
| Program | Vss (0V) | Vss (0V) | Vss (0V) | Vss (0V) | Vdd (2.5V) | Vdd (2.5V)/ Vpgm H or Vpgm or Vpass |
| Read | Vss (0V) | Vss (0V) | Vss (0V) | Vss (0V) | Vdd (2.5V) | Vdd (2.5V)/ Vread H or Vread |

F I G. 6

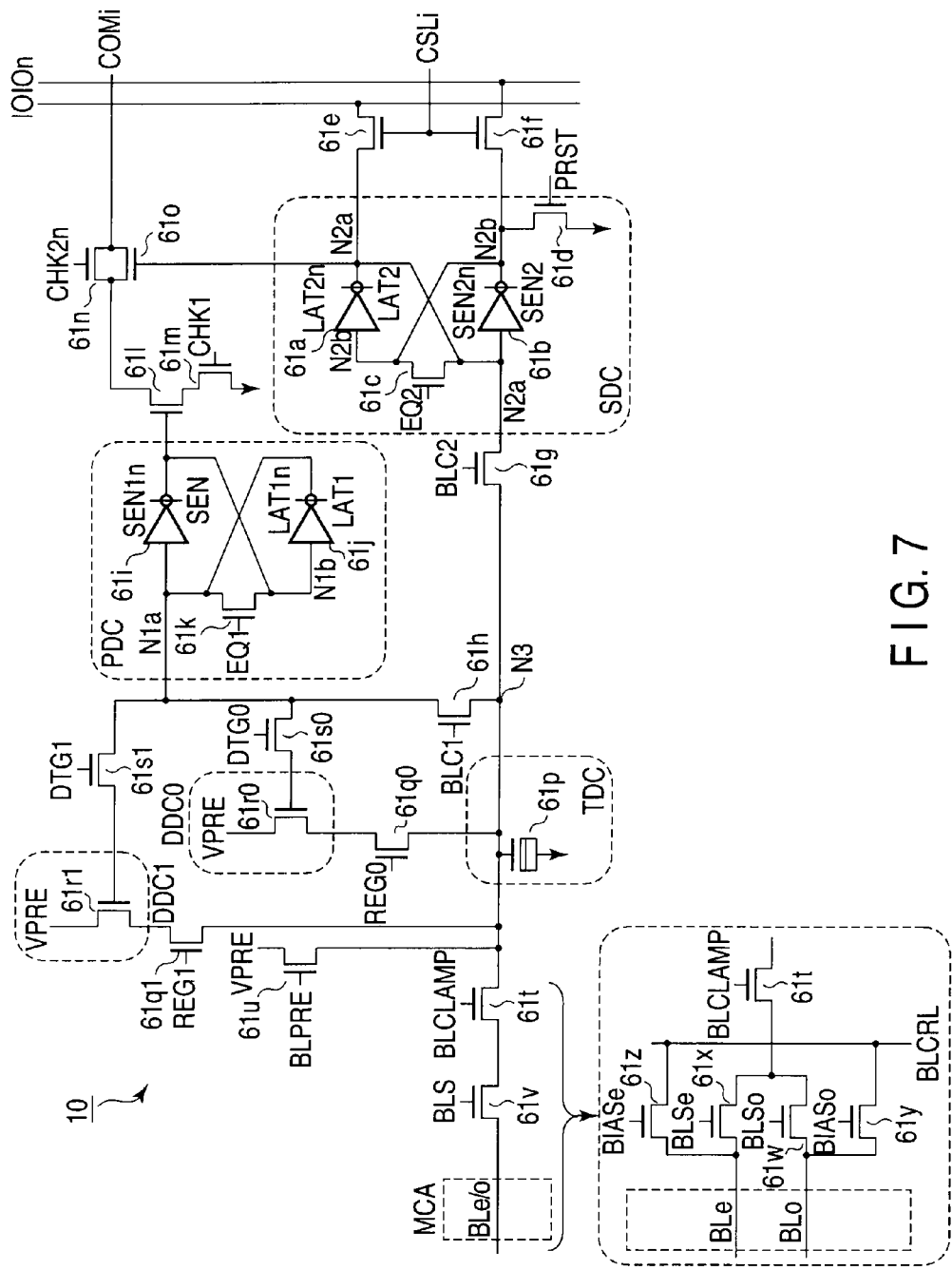
F I G. 7

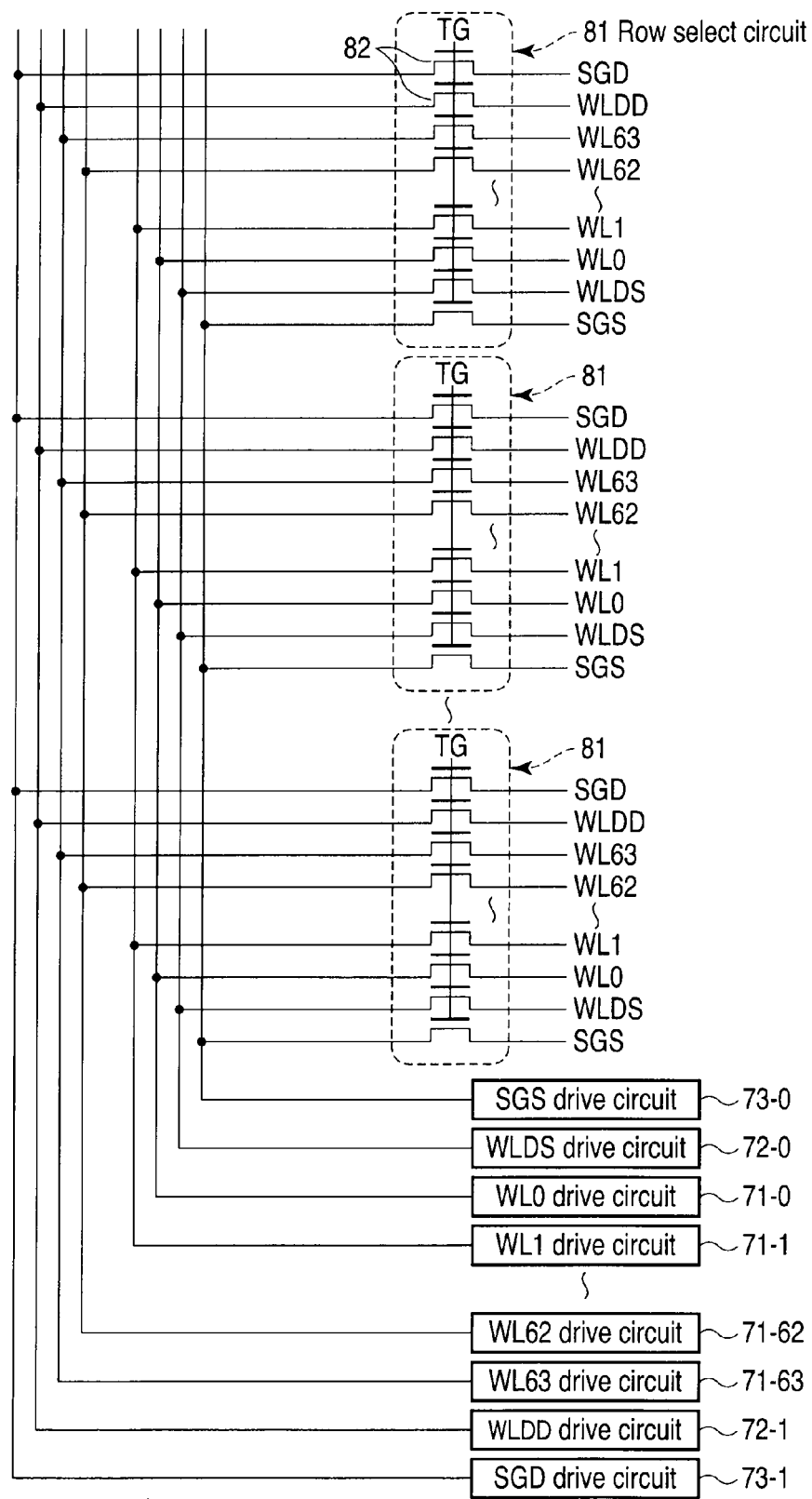
F I G. 8

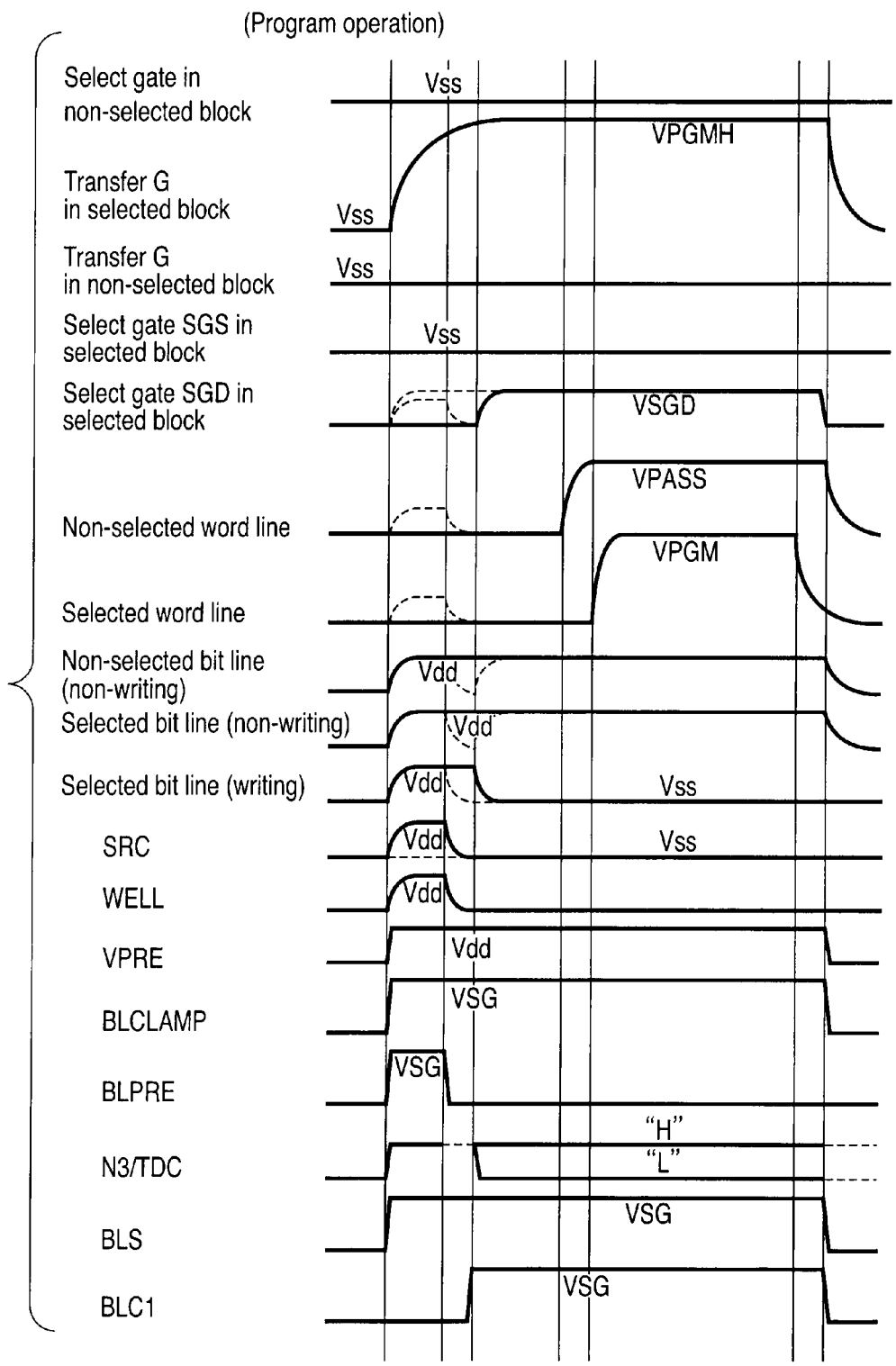
F I G. 13

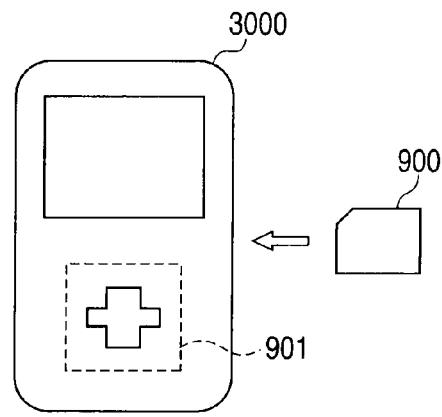
F I G. 22
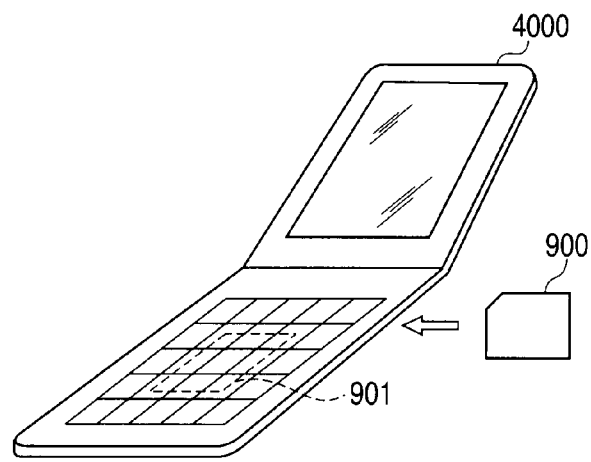
F I G. 23
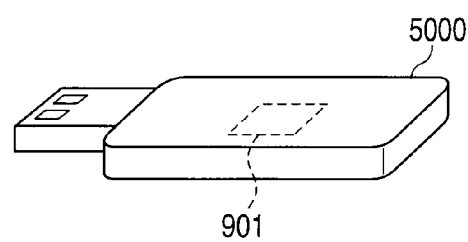
F I G. 24

SEMICONDUCTOR STORAGE DEVICE ADAPTED TO PREVENT ERRONEOUS WRITING TO NON-SELECTED MEMORY CELLS

CROSS-REFERENCE TO RELATED APPLICATIONS

This application is a continuation of and claims the benefit of priority under 35 U.S.C. §120 from U.S. Ser. No. 12/505,793 filed Jul. 20, 2009, and claims the benefit of priority under 35 U.S.C. §119 from Japanese Patent Application No. 2008-290225 filed Nov. 12, 2008, the entire contents of each of which are incorporated herein by reference.

BACKGROUND OF THE INVENTION

1. Field of the Invention

The present invention relates to, for example, a NAND flash memory and more particularly to a semiconductor storage device capable of storing multilevel data into memory cells.

2. Description of the Related Art

In a NAND flash memory, a number of memory cells arranged in the row direction are connected to a corresponding word line and all or half of a number of memory cells arranged in the column direction are connected in series to form a NAND unit. The drain side of this NAND unit is connected to a corresponding bit line through a select gate. Each of the bit lines is connected a write and read latch circuit. All or half of the cells arranged in the row direction (e.g., 2 to 8-KB cells) are collectively written to or read from. In an erase operation, the threshold voltage of memory cells is made negative. Injection of electrons into memory cells in a write operation sets the threshold voltage positive (see, for example, Jpn. Pat. Appln. KOKAI No. 2004-192789).

With the NAND flash memory, a number of memory cells are connected in series; therefore, it is required to set non-selected cells to the on state in a read operation, in which case a read voltage (Vread) higher than the threshold voltage is applied to the gates of the cells. For this reason, the threshold voltage in a write operation does not have to exceed Vread. In a write sequence, it is necessary to repeatedly carry out a program operation and a program verify read operation for each bit to control the distribution of threshold voltages so that Vread is not exceeded. Accordingly, the write speed is lowered.

In addition, in order to store large amounts of data, multi-level memories have been developed in which one cell can store more than one bit. For example, in a case where one cell stores two bits, it is required to set four threshold distributions. In comparison with a memory in which one cell stores one bit, it is necessary to write so that each one of four threshold distributions becomes narrow. Therefore, the write speed becomes than that of the memory in which one cell stores one bit.

Therefore, in order to write to a high threshold, it is required to apply a high write voltage to a selected word line. However, non-writing cells which are connected to the same word line must not be written. It is therefore necessary to set (boot) the potential on the channel region high at the write time. To this end, it is only required to set the voltage (Vpass) on non-selected word lines to a high level. In this case, however, there arises a problem that cells which are not to be written to and which constitute a NAND unit together with cells to be written to are actually written to. For this reason, it is desired to set the potential on the non-selected word lines as low as possible and the potential on the channel region high.

Thus, a semiconductor storage device has been demanded which can prevent erroneous writing to non-selected cells and write a plurality of threshold voltages at high speed without setting the potential (Vpass) high.

BRIEF SUMMARY OF THE INVENTION

According to a first aspect of the invention, there is provided a semiconductor storage device comprising: a memory cell array having a number of memory cells which are connected to word lines and bit lines and are arranged in a matrix form, each of the memory cells storing one of n levels (n is a natural number of 2 or more); and a control circuit configured to control the potentials on the word lines and the bit lines in accordance with input data to write data to the memory cells, the control circuit being adapted to, at the write time, first apply a first potential to a well region or substrate in which the memory cells are formed, then set the well region or substrate to a second potential lower than the first potential, and next apply a predetermined voltage to the word lines to thereby perform a write operation.

According to a second aspect of the invention, there is provided a method of writing to a semiconductor storage device comprising: applying a first potential to a well region or substrate having memory cells formed in it; then setting the well region or substrate to a second potential lower than the first potential; and next applying a predetermined voltage to a word line to write to the cells connected to the word line.

BRIEF DESCRIPTION OF THE SEVERAL VIEWS OF THE DRAWING

FIG. 3 shows another circuit arrangement of the memory cell array;

FIGS. 4A and 4B are sectional views of a memory cell and a select transistor;

FIG. 6 shows examples of voltages applied to the regions shown in FIG. 5;

FIG. 7 shows a circuit arrangement of the data storage circuit shown in FIGS. 2 and 3;

FIG. 8 is a circuit diagram showing arrangements of row select circuits and drive circuits;

FIG. 13 is a voltage waveform diagram illustrating an example of a program operation;

FIGS. 16 to 24 are a diagram showing an example of other applications.

DETAILED DESCRIPTION OF THE INVENTION

An embodiment of the present invention will be described hereinafter with reference to the accompanying drawings.

Figure 1:
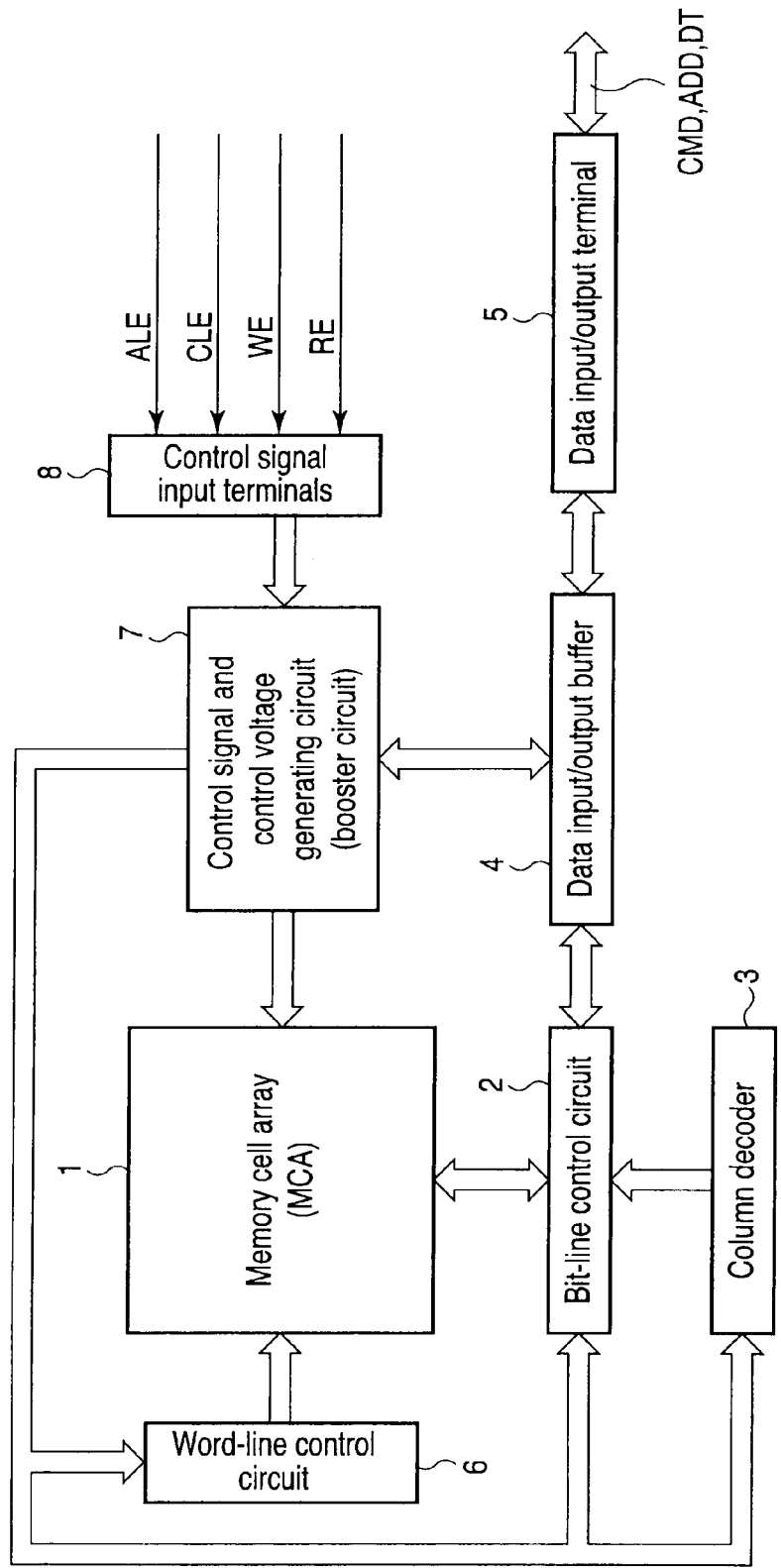
FIG. 1 is a schematic block diagram of a semiconductor storage device according to an embodiment.

FIG. 1 shows the arrangement of a NAND flash memory in which one memory cell stores two levels (one bit) or four levels (two bits).

A memory cell array 1 includes a number of bit lines, a number of word lines, and a common source line and has electrically rewritable memory cells, such as EEPROM cells, arranged in a matrix. To the memory cell array 1 are connected a bit-line control circuit 2 and a word-line control circuit 6.

The bit line control circuit 2 is adapted to read from the memory cells in the memory cell array 1 through the bit lines, detect the states of the memory cells through the bit lines, or write to the memory cells by applying a write control voltage to them through the bit lines. To the bit-line control circuit 2 are connected a column decoder 3 and a data input/output buffer 4. Data storage circuits in the bit line control circuit 2 are each selected by the column decoder 3. Memory cell data read into the data storage circuits are output from data input/output terminals 5 through the data input/output buffer 4 to the outside. The data input/output terminals 5 are connected to a host (not shown) outside the memory chip. The host, which is comprised of, for example, a microcomputer, receives data output through the data input/output terminals 5. Furthermore, the host outputs various commands CMD to control the operation of the NAND flash memory, addresses ADD, and data DT. Write data input from the host to the data input/output terminals 5 are applied through the data input/output buffer 4 to data storage circuits selected by the column decoder 3. The commands and addresses from the host are applied to a control signal and control voltage generating circuit 7.

The word-line control circuit 6, which is connected to the memory cell array 1, selects word lines in the memory cell array and applies a voltage necessary to read, write, or erase to the selected word lines.

The memory cell array 1, the bit-line control circuit 2, the column decoder 3, the data input/output buffer 4 and the word-line control circuit 6 are connected to the control signal and control voltage generating circuit 7 and controlled by it. The control signal and control voltage generating circuit 7 is connected to control signal input terminals 8 and controlled by address latch enable (ALE), command latch enable (CLE) and write enable (WE) control signals which are input from the host to the control signal terminals. The control signal and control voltage generating circuit 7 generates voltages to be applied to the word and bit lines at the write time and voltages supplied to wells as will be described later. The voltage supplied to the wells is a voltage Vdd or a voltage VX which is higher or lower than Vdd. The control signal and control voltage generating circuit 7 includes a voltage stepup circuit, such as a charge pump circuit, and is allowed to generate a program voltage, the above voltage VX, and other high voltages.

The bit line control circuit 2, the column decoder 3, the word line control circuit 6 and the control signal and control voltage generating circuit 7 form a write/read circuit.

Figure 2:
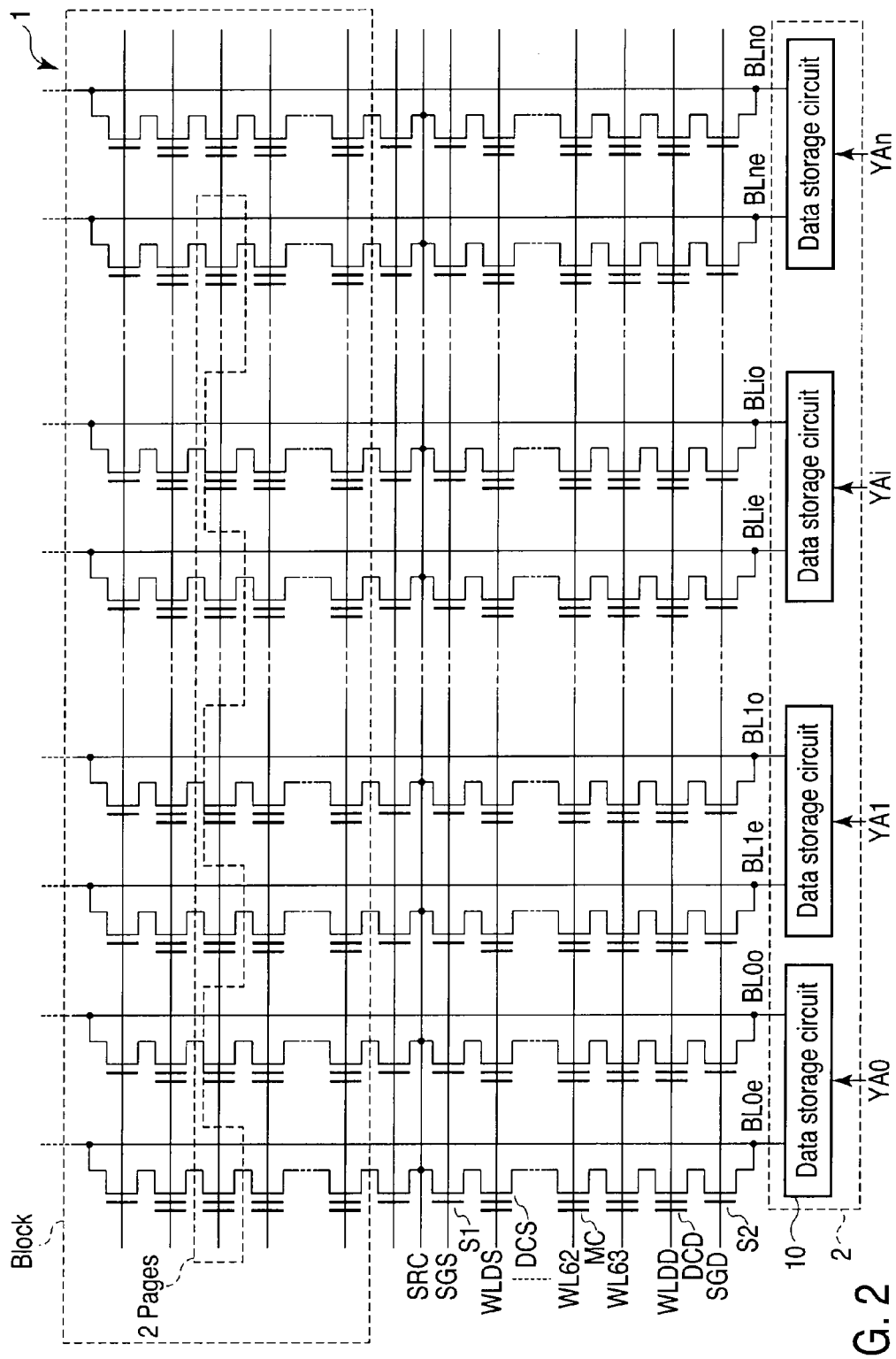
FIG. 2 shows a circuit arrangement of the memory cell array.

FIG. 2 shows an exemplary arrangement of the memory cell array 1 and the bit-line control circuit 2. The memory cell array 1 has a number of NAND units arranged. Each of the NAND units is composed of 64 EEPROM cells MC connected in series, two dummy cells DCS and DCD, and two select gates S1 and S2. Select gate S2 is connected to the bit line BL0e, while select gate S1 is connected to the source line SRC. The control gates of the memory cells MC arranged in each row are connected in common to a respective one of the word lines WL0 to WL63. The gates of the dummy cells DCS and DCD are connected to dummy word lines WLDS and WLDD, respectively. Select gates S2 are connected in common to a select line SGD, whereas select gates S1 are connected in common to a select line SGS.

The bit line control circuit 2 has a number of data storage circuits 10, each of which is connected a pair of bit lines (BL0e and BL0o, BL1e and BL1o, ..., BLie and BLio, ..., or BLne and BLno).

The memory cell array 1 includes a number of blocks as indicated by broken lines. Each of the blocks is composed of a number of NAND units. Data are erased in block units. The erase operation is carried out simultaneously as to the two bit lines connected to each data storage circuit.

Alternate memory cells which are arranged along each row and connected to one word line (memory cells enclosed by broken lines) form one sector. Data are written or read for each sector. That is, half of the memory cells which are arranged in the row direction are connected to corresponding bit lines. For this reason, a write or read operation is carried out on each half of the memory cells that are arranged in the row direction.

In a read operation, program verify operation, or program operation, one of the two bit lines (BLie and BLio) connected to each data storage circuit is selected according to an externally applied address signal (YA0, YA1, ..., YAi, ..., YAn). Moreover, one work line is selected according to an externally supplied address signal and two pages indicated by broken lines are selected. Switching between the two pages is made by an address signal.

When one cell stores two bits, memory cells arranged in the row direction form two pages. When one cell stores one bit, these cells form one page. When one cell stores three bits, these cells form three pages. When one cell stores four bits, these cells form four pages.

FIG. 3 shows another arrangement of the memory cell array 1 and the bit line control circuit 2 shown in FIG. 1. In the arrangement of FIG. 2, paired bit lines (BLie and BLio) are connected to a corresponding one of the data storage circuits 10. In contrast, in the arrangement of FIG. 3, each bit line is connected to a separate data storage circuit and each of the memory cells arranged in the row direction is connected to a corresponding one of the bit lines. For this reason, a read or write operation can be performed on each of the memory cells arranged in the row direction.

The following description can be applied to either of the arrangements of FIGS. 2 and 3. Here, a description is given of the case where the arrangement of FIG. 3 is used.

FIGS. 4A and 4B are sectional views of a memory cell and a select transistor, respectively. With the memory cell of FIG. 4A, a substrate 51 (P-type well region 55 to be described later) has n-type diffusion layers 42 as the source and drain of the memory cell formed in it. A floating gate (FG) 44 is formed above the P-type well region 55 with a gate insulating film 43 interposed therebetween. A control gate (CG) 46 is formed over the floating gate 44 with an insulating film 45 interposed therebetween. With the select gate of FIG. 4B, the P-type well region 55 has n-type diffusion layers 47 as the source and drain formed in it. A control gate 49 is formed over the P-type well region 55 with a gate insulating film 48 interposed therebetween.

Figure 5:
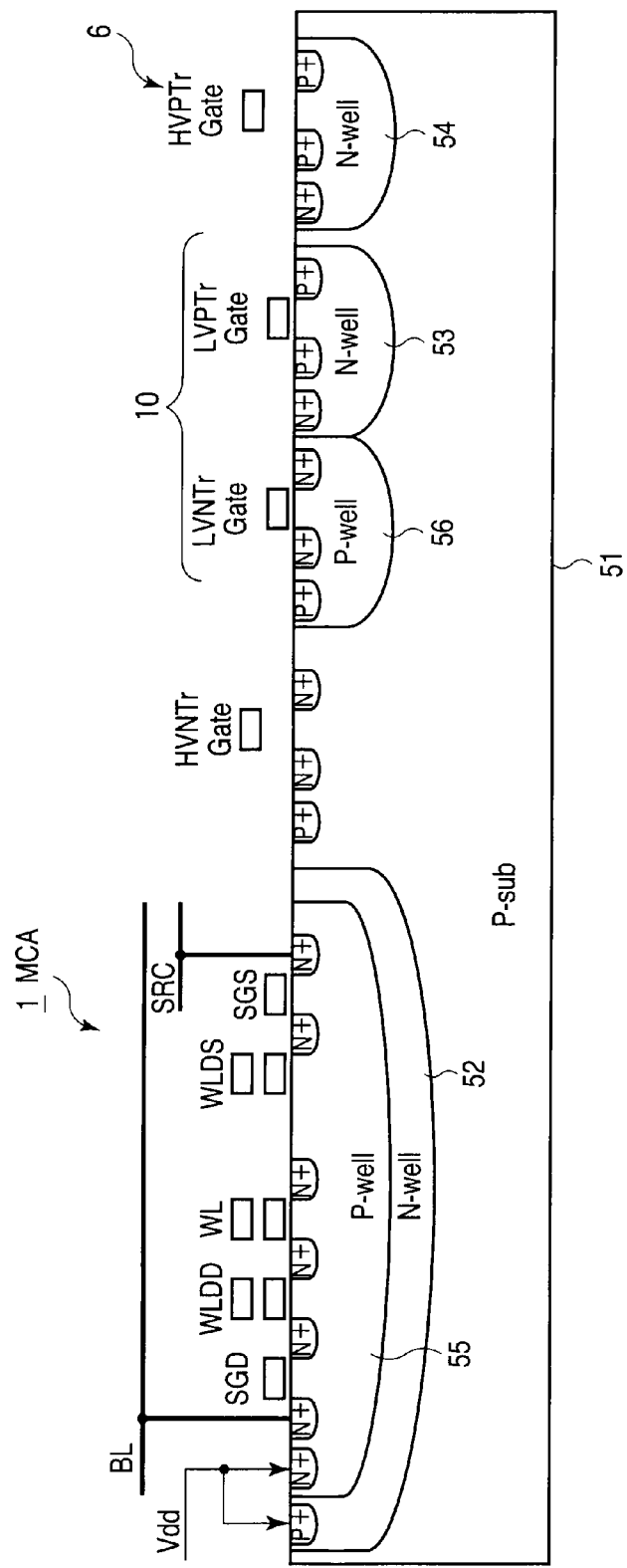
FIG. 5 is a sectional view of a NAND flash memory.

FIG. 5 is a sectional view of the NAND flash memory. For example, N-type well regions 52, 53 and 54 and a P-type well region 56 are formed in a P-type semiconductor substrate 51. A P-type well region 55 is formed in the N-type well region 52. Low-voltage N-channel transistors LVNTr constituting the memory cell array 1 are formed in the P-type well region 55. Furthermore, low-voltage P-channel transistors LVPTr and low-voltage N-channel transistors LVNTr, which form the data storage circuits 10, are formed in the N-type well region 53 and the P-type well region 56, respectively. The substrate 51 is formed in it with high-voltage N-channel transistors HVNTr which connect the bit lines to the data storage circuits 10. The N-type well region 54 is formed in it with high-voltage P-channel transistors HVPTr which form a word-line drive circuit and so on. As shown in FIG. 5, the high-voltage transistors HVNTr and HVPTr are set larger in the thickness of the gate insulating film than the low-voltage transistors LVNTr and LVPTr.

The P- and N-type well regions 55 and 52 formed with the memory cell array 1 are supplied with a voltage Vdd or a voltage VX which is higher or lower than Vdd at the write time as will be described later. For this reason, the channel potential of the memory cells is raised by temporarily applying the voltage Vdd or VX to the well regions 55 and 52 at the write time to thereby supply a voltage to the $N^+$ diffusion layers of the cells. Therefore, erroneous writing to non-selected cells is prevented.

FIG. 6 shows exemplary voltages applied to the regions shown in FIG. 5. In erase, program (well voltage stepup), program and read operations, such voltages as shown in FIG. 6 are applied to the regions. Here, Vera is a voltage applied to the substrate at the erase time, Vss is the ground voltage, and Vdd is the supply voltage. VX is a voltage which is higher or lower than Vdd. VpgmH is a voltage applied to the gates of N-channel MOS transistors within the row decoder at the write time and is a potential to allow the write voltage Vpgm applied to the word lines to pass without being lowered by the threshold voltage of the N-channel MOS transistors. That is, VpgmH is Vpgm+Vth where Vth is the threshold voltage of the N-channel MOS transistors. Vpass is a voltage which is applied to word lines associated with non-selected cells at the write time. Vread is a voltage which is applied to non-selected word lines at the read time. VreadH is a voltage which is applied to the gates of the N-channel MOS transistors in the row decoder at the read time and is a potential to allow Vread to pass without being lowered by the threshold voltage of the N-channel MOS transistors. That is, VreadH is Vread+Vth, which is applied to the word lines at the read time.

FIG. 7 is a circuit diagram of the data storage circuits 10 shown in FIG. 3.

The data storage circuit 10 is adapted to read or write 2-bit (four-levels) data and has a primary data cache (PDC), a secondary data cache (SDC), dynamic data caches (DDC0 and DDC1), and a temporary data cache (TDC). The caches SDC, PDC, DDC0 and DDC1 are used to hold input data at the write time, hold read data at the read time, temporarily retain data at the verification time, and operate internal data in storing multilevel data. The cache TDC is used to amplify and temporarily retain data on the bit line at the read time and operate internal data in storing multilevel data.

The cache SDC is composed of clocked inverter circuits 61*a* and 61*b* to form a static latch circuit and transistors 61*c* and 61*d*. The transistor 61*c* is connected between the inputs of the clocked inverter circuits 61*a* and 61*b* to receive a signal EQ2 at its gate. The transistor 61*d* is connected between the output of the clocked inverter 61*a* and ground to receive a signal PRST at its gate. Node N2*a* of SDC is connected to an input/output data line IO through a column select transistor 61*e*, whereas node N2*a* of SDC is connected to an input/output data line IOn through a column select transistor 61*f*. The transistors 61*e* and 61*f* are connected to receive a column select signal CSLi at their common gates. Node N2*a* of SDC is connected to node N1*a* of PDC through transistors 61*g* and 61*h*. The transistor 61*g* is connected to receive a signal BLC2 at its gate, whereas the transistor 61*h* is connected to receive a signal BLC1 at its gate.

The cache PDC is constructed from clocked inverter circuits 61I and 61*j* that form a static latch circuit and a transistor 61*k*. The transistor 61*k* is connected between the inputs of the clocked inverter circuits 61*i* and 61*j* to receive a signal EQ1 at its gate. Node N1b of PDC is connected to the gate of a transistor 61*l*, which has its current path connected at one end thereof to ground by a transistor 61*m*. The gate of the transistor 61*m* is supplied with a signal CHK1. The other end of the current path of the transistor 61*l* is connected to one end of the current path of each of transistors 61*n* and 61*o* that constitute a transfer gate. The transistor 61*n* is connected to receive a signal CHK2*n* at its gate. The gate of the transistor 61*o* is connected to node N2*a* of SDC. The other end of the current path of each of the transistors 61*n* and 61*o* is connected to a signal line COMi, which is connected in common to all the data storage circuits 10. The voltage level on the signal line COMi allows a decision to be made as to whether or not verification of all the data storage circuits 10 has been completed. That is, as will be described later, upon completion of the verification, node N1b of PDC goes low (node N1*a* goes high). In this state, when the signals CHK1 and CHK2*n* go high, the signal line COMi goes high.

The cache TDC is comprised of a MOS capacitor 61*p* by way of example. The capacitor 61*p* has its one end connected to node N3 at which the transistors 61*g* and 61*h* are connected together and its other end connected to ground. To node N3 are connected DDC0 and DDC1 via transistors 61*q*0 and 61*q*1, respectively. The transistors 61*q*0 and 61*q*1 are connected at their gates to receive signals REG0 and REG1, respectively.

The caches DDC0 and DDC1, which form a dynamic latch circuit, comprise transistors 61*r*0 and 61*r*1, respectively. The transistors 61*r*0 and 61*r*1 are connected at one end of their respective current path to receive a signal VPRE and connected at the other end to the current paths of the transistors 61*q*0 and 61*q*1, respectively. The gates of the transistors 61*r*0 and 61*r*1 are connected to node N1*a* of the cache PDC through transistors 61*s*0 and 61*s*1, respectively. The transistors 61S0 and 61*s*1 are connected at their gates to receive signals DTG0 and DTG1, respectively.

To node N3 is connected one end of the current path of each of transistors 61*u* and 61*t*. The transistor 61*u* is connected to receive a signal VPRE at the other end of its current path and a signal BLPRE at its gate. The transistor 61*t* is connected at the other end of its current path to a bit line BLo/e through a transistor 61*v* and to receive a signal BLCLAMP at its gate.

In the case of the data storage circuit shown in FIG. 2, the arrangement of the transistor 61*t* and the odd- and even-numbered bit lines BLo and BLe is modified as shown in the lower left portion of FIG. 7.

That is, transistors 61*w* and 61*x* are connected between the transistor 61*t* and the odd and even bit lines BLo and BLe. The transistors 61*w* and 61*x* are connected at their gates to receive signals BLSo and BLSe, respectively. To the connection node of the bit line BLo and the transistor 61*w* is connected one end of the current path of a transistor 61*y*. To the connection node of the bit line BLe and the transistor 61*x* is connected one end of the current path of a transistor 61*z*. The transistors 61*y* and 61*z* are connected at their gates to receive signals BIASo and BIASe, respectively, and to receive a signal BLCRL at the other end of their respective current path. For this reason, the bit lines BLo and BLe are supplied with the signal BLCRL through the transistors 61y and 61z, respectively. The signal BLCRL is a voltage to be applied to non-selected bit lines in read and program operations.

In the description which follows, let data from PDC be the potential at node N1a, data from SDC to be the potential at node N2a, and data from TDC be the potential at node N3. Let data from DDC0 and DDC1 be the potentials at the gates of the transistors 61r0 and 61r1, respectively.

The signals and voltages described above are generated by the control signal and control voltage generating circuit 7 shown in FIG. 1. The write, verification and read operations are carried out under the control of the control signal and control voltage generating circuit 7.

FIG. 8 shows row select circuits and word-line drive circuits in the word-line control circuit 6 shown in FIG. 1. Each of the row select circuits 81 is placed to correspond to a respective one of the blocks shown in FIG. 2 or 3. Each row select circuit comprises a number of transfer gates 82 each of which is comprised of an N-channel MOS transistor. The gate electrodes TG of the transfer gates 82 are connected together.

The word lines WL0 to WL63, dummy word lines WLDS and WLDD and select lines SGS and SGD in each block are connected to one ends of the current paths of the respective transfer gates 82 in a corresponding one of the row select circuits 81. The other ends of the transfer gates 82 are connected to word-line (WL0 to WL63) drive circuits 71-0 to 71-63, dummy word line (WLDS, WLDD) drive circuits 72-0 and 72-1, and select-line (SGS, SGD) drive circuits 73-0 and 73-1. The word-line drive circuits, dummy word-line drive circuits and select-line drive circuits, which are set in the control signal and control voltage generating circuit 7 by way of example, generate predetermined voltages in the write (program), verify, read and erase operations.

Figure 9A:
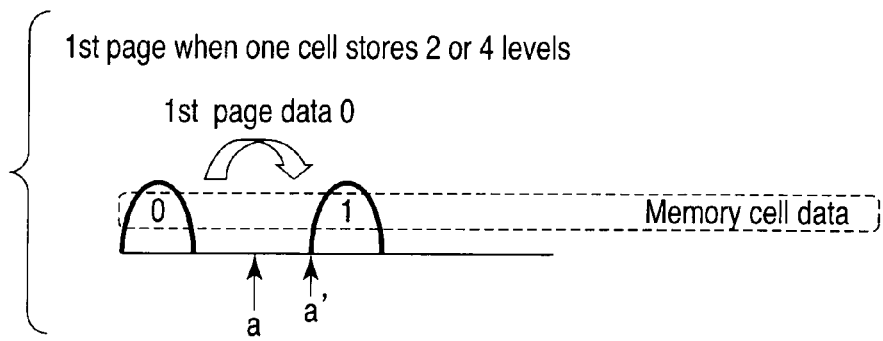
FIGS. 9A, 9B and 9C show memory cell threshold voltage distributions associated with write and erase operations.
Figure 9B:
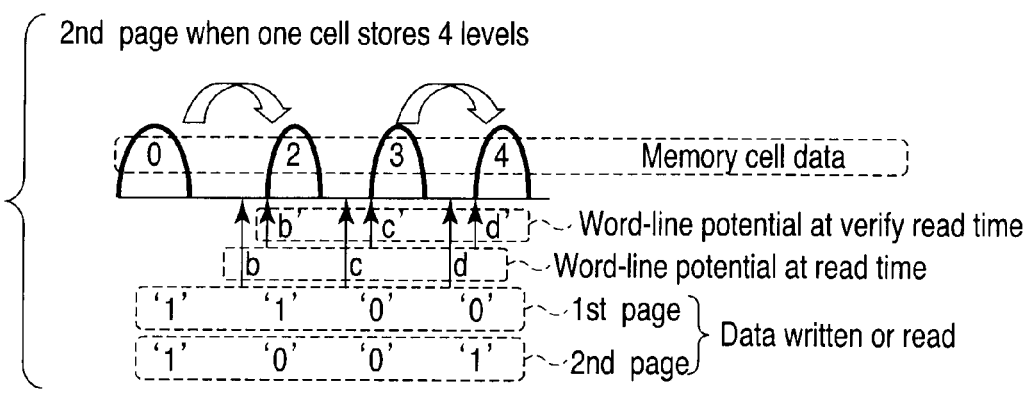
Figure 9C:

FIGS. 9A, 9B and 9C show the relationship between memory cell data and thresholds. As shown in FIG. 9C, the erase operation sets memory cell data to "0". As shown in FIG. 9A, when one cell stores one bit (two levels), the write operation sets memory cell data to "0" and "1". When one cell stores two bits (four levels), one bit of data is written to the first page with the result that memory cell data become "0" and "1" as shown in FIG. 9A. Another bit of data is written to the second page with the result that memory cell data become "0", "2", "3" and "4" as shown in FIG. 9B. In this embodiment, data "0", "2", "3" and "4" are defined in increasing order of threshold voltages.

(Erase Operation)

The erase operation is carried out in the block unit shown by the dotted line of FIGS. 2 and 3. After erase, memory cell data becomes "0" as shown in FIG. 9C.

(Read Operation)

When one cell stores one bit (two levels) as shown in FIG. 9A, the memory cell data exists in the form of "0" or "1". For this reason, these data can be read out by performing a read operation at an intermediate level "a" between threshold voltages for data "0" and "1".

When one cell stores two bits (four levels) as shown in FIG. 9B, the memory cell data exist in the form of "0", "2", "3", and "4". For this reason, these data can be read out by performing a read operation at an intermediate level "b" between threshold voltages for "0" and "2", at an intermediate level "c" between threshold voltages for "2" and "3", and at an intermediate level "d" between threshold voltages for "3" and "4".

Figure 10:
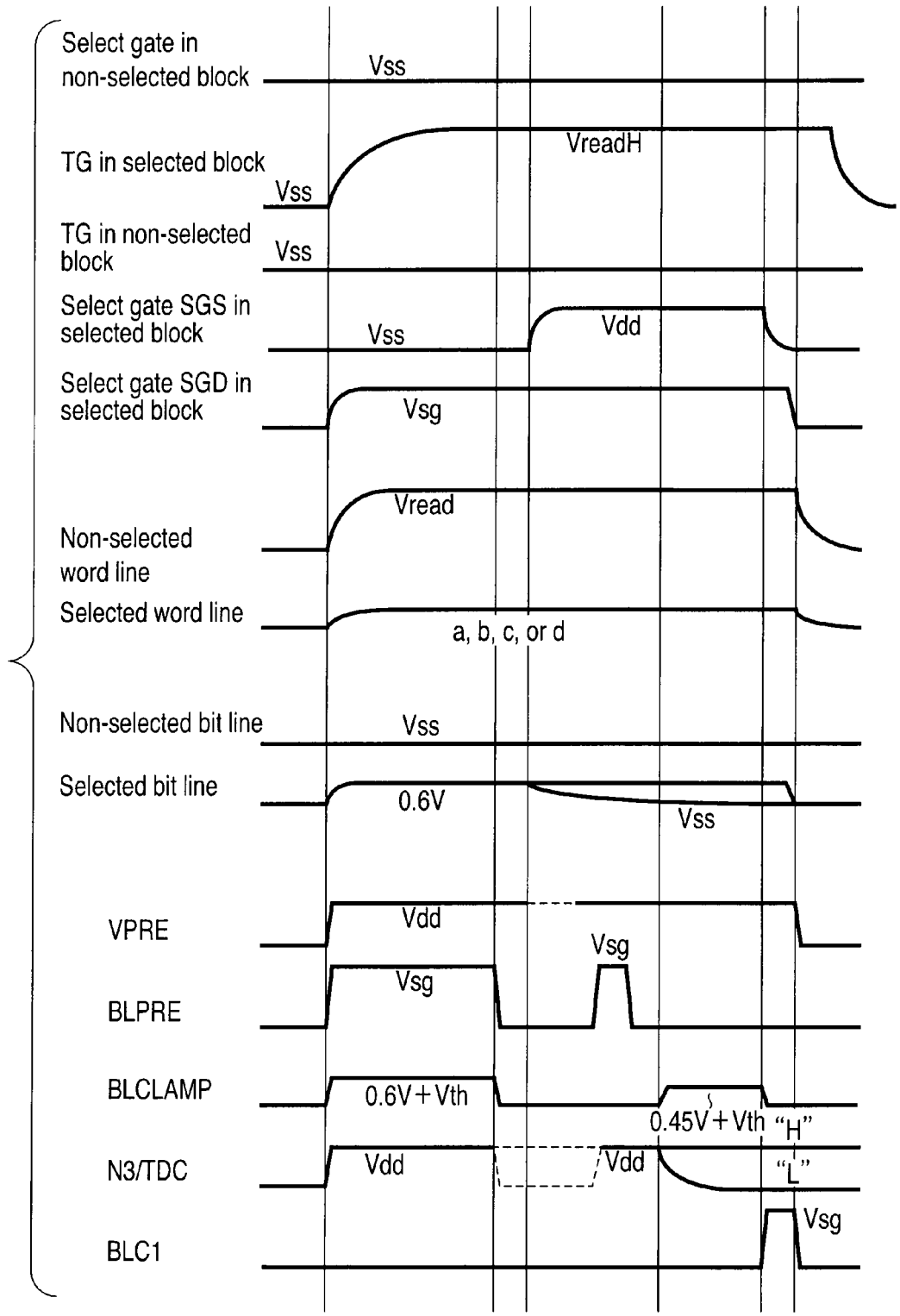
FIG. 10 is a voltage waveform diagram illustrating read and read verify operations.

FIG. 10 is a voltage waveform diagram illustrating the read and verify read operations. The read operation will now be described with reference to FIG. 10.

First, the well of a selected cell, the source line and non-selected bit lines are set to 0 V.

The voltage VreadH (=Vread+Vth) is applied to the gate electrodes TG of the transfer gates 82 associated with a selected block. One of the voltages "a", "b", "c" and "d" at the read time (e.g., "a"="b"=0 V) is applied to a selected word line through the word line drive circuits 71-0 to 71-63. At the same time, non-selected word lines of the selected block are supplied with Vread, the select line SGD of the selected block is supplied with Vsg(=Vdd+Vth), the select line SGS is supplied with Vss. Furthermore, the signal VPRE in the data storage circuit 10 shown in FIG. 7 is set to Vdd (e.g., 2.5 V). The signal BLPRE is set to Vsg(=Vdd+Vth) and the signal BLCLAMP is temporarily set to a voltage of, for example, (0.6 V+Vth). Thereby, the selected bit line is precharged to, for example, 0.6 V.

Next, the select line SGS on the source side of the selected memory cell is set to Vsg(=Vdd+Vth). When the threshold voltage of the memory cell is higher than one of the voltages "a", "b", "c" and "d" (e.g., "a"="b"=0 V), the cell is turned off. For this reason, the bit line remains at the high level (e.g., 0.6 V). When the threshold voltage of the memory cell is lower than one of the voltages "b", "c" and "d", (e.g., "b"=0 V), the cell is turned on. Thus, the bit line is discharged to the same potential as the source line, namely, Vss.

After that, the signal BLPRE in the data storage circuit 10 of FIG. 7 is temporarily set to Vsg(=Vdd+Vth) to precharge node N3 of TDC to Vdd and then signal BLCLAMP is set to, for example, (0.45 V+Vth). When the voltage on the bit line is lower than 0.45 V, node N3 of TDC goes low; otherwise, the node remains at the high level. Here, the signal BLC1 is set to Vsg(=Vdd+Vth) to read the potential of TDC into PDC. Therefore, when the threshold voltage of the memory cell is lower than "a", "b", "c" and "d", PDC goes low; otherwise, PDC goes high.

When all the cells arranged in the row direction as shown in FIG. 3 are read collectively, the select line SGS of the selected block is made high simultaneously with the select line SGD. Thus, when the cell is in the on state after the bit line has been charged, the bit line is discharged; otherwise, the bit line is maintained in the charged state.

As described above, the bit-line level is read into PDC through TDC. For this reason, when the number of cells which are in the on state is large, a large current flows from the signal VPRE to the source. Therefore, there arises a problem that the source potential floats. To suppress this, the read operation is carried out a plurality of times. First, with cells which turn on, that is, cells through which current flows even if the source floats, the results of read are taken to be a low level. The read operation is performed again on cells which were read as the low level in the first read operation without discharging the bit lines.

(Program and Program Verify Operations)

(Program Operation)

Figure 11:
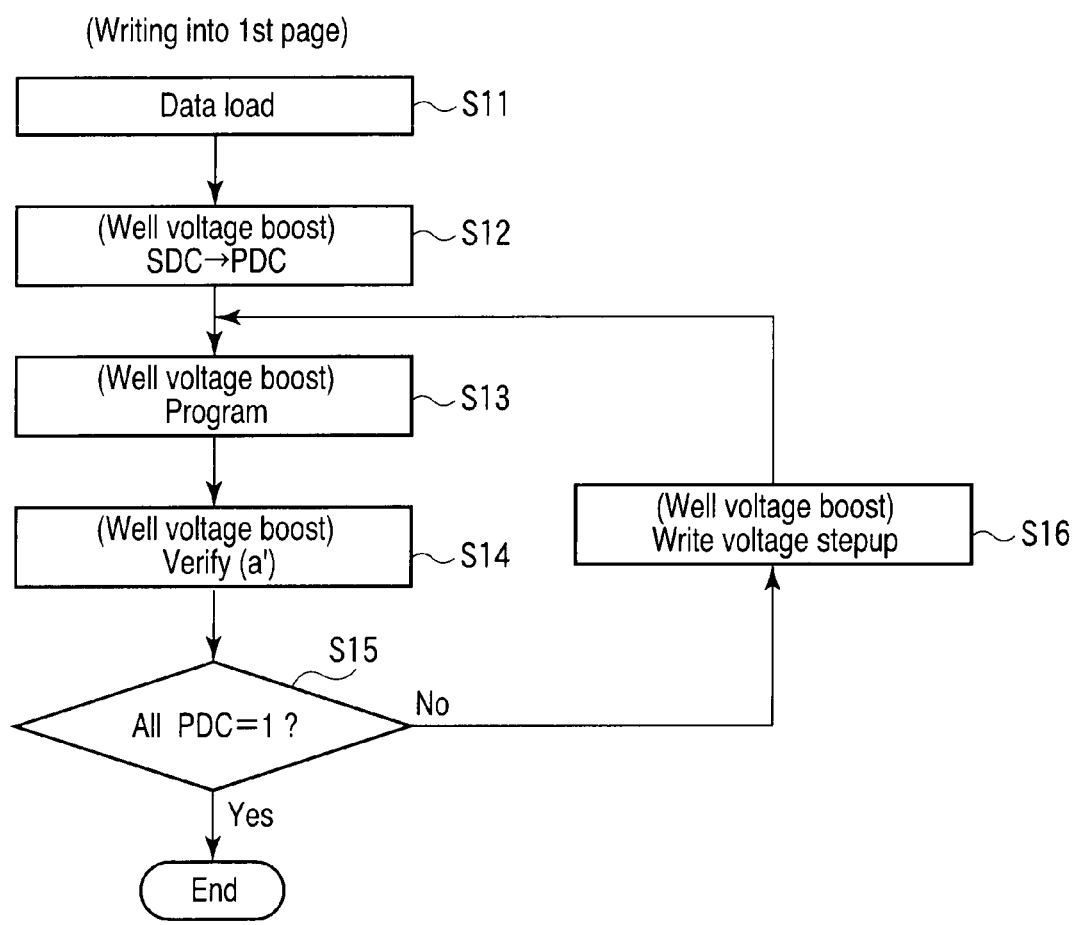
FIG. 11 is a flowchart illustrating a write operation for the first page.
Figure 12:
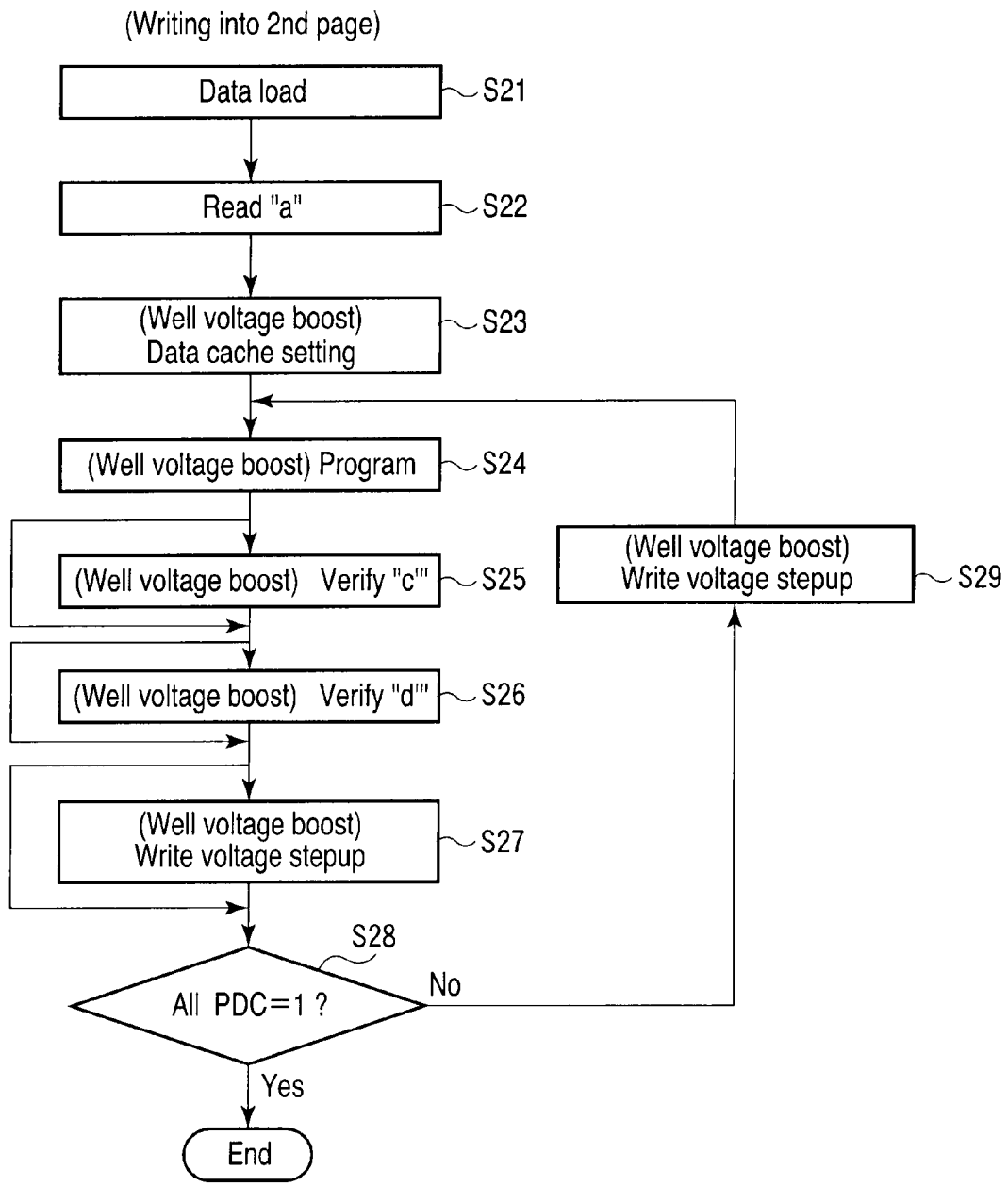
FIG. 12 is a flowchart illustrating a write operation for the second page.

FIG. 11 shows a program operation for the first page and FIG. 12 shows a program operation for the second page. Reference is now made to FIGS. 11, 12 and 13 to describe the program operation.

In the program operation, an address is designated first to select two pages shown in FIG. 3. With this memory, the two pages can be programmed only in the order of the first page and the second page. Therefore, the first page is selected first.

(First-Page Program)

Write data are input from outside and stored into the caches SDC of all the data storage circuits 10 (S11). When a write command is input, the data in the caches SDC in the data storage circuits 10 are transferred to the caches PDC (S12).

When data "1" (not to be written) is input from outside, node N1a of the cache PDC goes high. When data "0" (to be written) is input, node N1a goes low. In the description which follows, let the PDC data be the potential on node N1a in the data storage circuit 10 and the SDC data be the potential on node N2a.

(Program Operation (S13))

First, as shown in FIG. 13, the signals BLS, BLCLAMP and BLPRE are each set to the voltage VSG (e.g., Vdd+Vth). The signal VPRE is set to the voltage Vdd. The well regions 55 and 52 in which the memory cell array 1 is formed are also set to the voltage Vdd. After that, all the bit lines are set to Vdd. Thus, the well regions 55 and 52 and all the bit lines are set to the same potential, which results in decreased capacitance and hence allows the charging time to be reduced.

As shown in FIG. 13, the source line SRC is also supplied with the same voltage Vdd as the well regions 55 and 52. However, since the N$^+$ diffusion layer to which the source line is connected is in the forward direction with respect to the P-type well region 55, when the P-type well region is at a high potential, the source line SRC is maintained at the same potential as the well region even if the source line is not supplied with the voltage Vdd. For this reason, the source line SRC may be floating or set to a voltage lower than Vdd.

By applying the voltage Vdd to the well regions 55 and 52, the N$^+$ diffusion layers as the source and drain of a memory cell are charged to Vdd.

The voltage of the well regions 55 and 52 is not limited to Vdd. A higher voltage than Vdd allows the channel region of the cell to be charged to a higher voltage. Therefore, the channel region of the cell is boosted to a high voltage, allowing the effect of preventing erroneous writing to be enhanced. However, it is also desirable to set the optimum voltage that can reduce erroneous writing.

When a voltage higher than Vdd is required, it is only required to set a voltage stepup circuit in the control signal and control voltage generating circuit 7 shown in FIG. 1 as described above. Conversely, when a voltage lower than Vdd is needed, it is only required to set a voltage stepdown circuit in the control signal and control voltage generating circuit to generate a voltage lower than Vdd.

When a stepped-up voltage cannot be directly applied to the bit line, the bit-line potential can be raised in the following manner. First, a voltage, such as Vdd, is applied to the bit line and then one or both of the signals BLS and BLCLAMP shown in FIG. 7 are set low temporarily. Thereby, the transistor 61v and/or 61t is turned off to make the bit line floating. After that, the well regions 55 and 52 or the well regions and the source line SRC are set to a high voltage, thereby allowing the bit line to be driven to a voltage higher than Vdd.

When a voltage is applied to the N$^+$ diffusion layers of the memory cells, a voltage enough to turn on select gates S1 and S2 and the memory cells may be applied to the select line SGD for select gates S2 or the select line SGS for select gates S1 and each word line. Thus, it is also possible to charge the diffusion layers through the bit line by applying a voltage to the bit line in the state where select gates S1 and S2 and the memory cells are in the on state.

Figure 14:
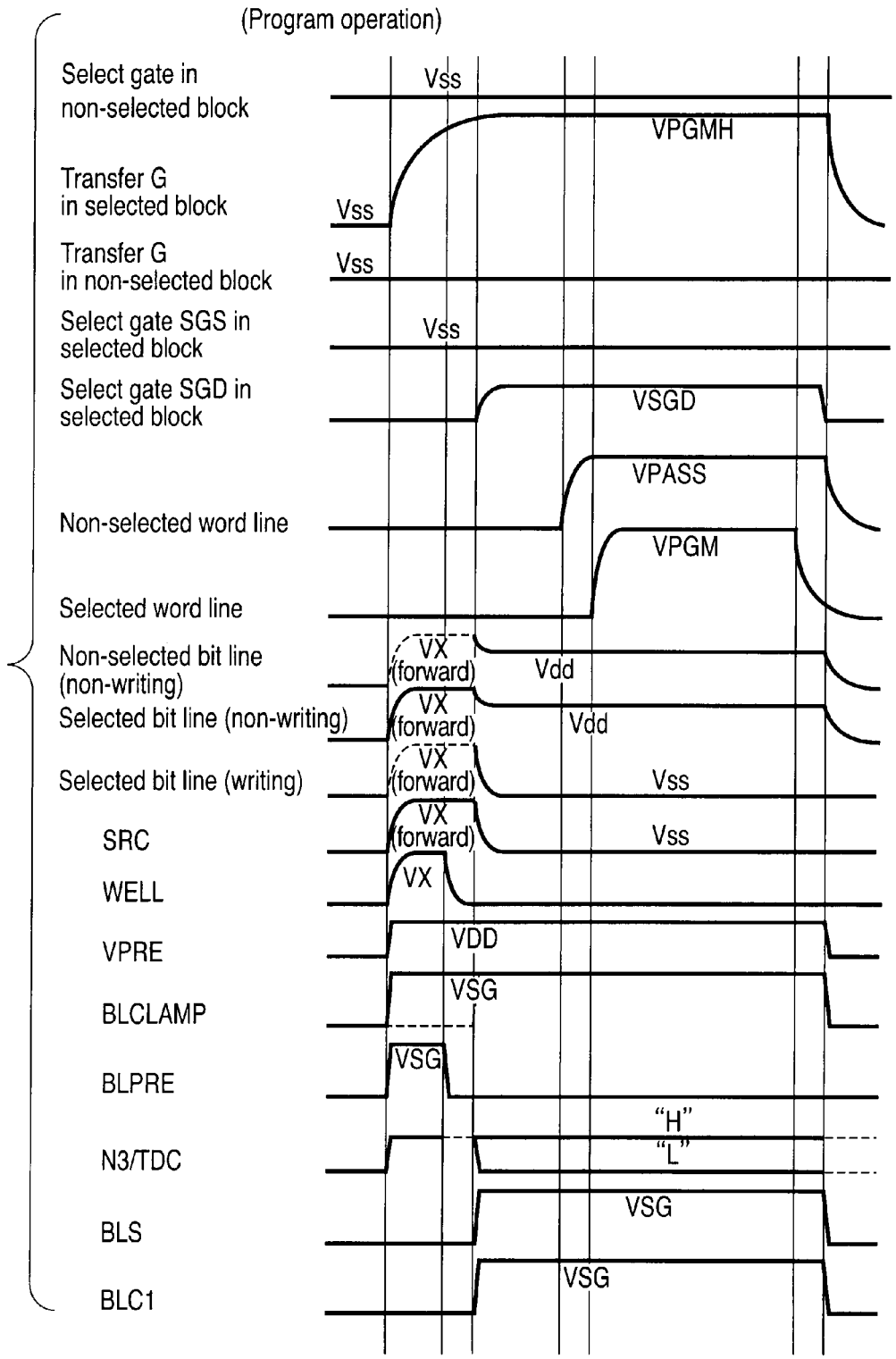
FIG. 14 is a voltage waveform diagram illustrating another example of a program operation.

Furthermore, as shown in FIG. 14, it is also possible to apply the voltage VX higher than Vdd to the N$^+$ diffusion layers by first setting the signal BLS to Vss to make the bit line floating and then driving the well regions 55 and 52 to VX. In this case, since the N$^+$ diffusion layers of the select gate are set to VX by driving the well regions 55 and 52 to VX, the bit line is charged to VX through the well regions. At this point, the source line SRC may be set to the same voltage VX as the well regions 55 and 52 or may be made floating. Thereby, the N$^+$ diffusion layers of the memory cell are set to the voltage VX.

After that, the voltage of the well regions is lowered from VX to Vss and then the signal BLS is set to the voltage VSG (e.g., Vdd+Vth), allowing a read operation to be performed with the bit line supplied with a given voltage.

Here, the well regions and the bit lines are initially charged by using a voltage of VX higher than Vdd. This is not restrictive. The initial charging voltage VX may be Vdd or a voltage lower than Vdd.

After the N$^+$ diffusion layers of the memory cell have been charged to the voltage VX in the above manner, the voltage applied to the well regions is lowered to Vss, for example. In this state, however, the PN junctions formed from the N$^+$ diffusion layers and the well region 55 are reverse biased; therefore, the N$^+$ diffusion layers remain at the high voltage level.

After that, the signal BLC1 shown in FIG. 7 is set to VSG (e.g., Vdd+Vth). If, in this state, data "1" (not to be written) is stored in PDC, the potential on the bit line remains Vdd. If, on the other hand, data "0" (to be written) is stored, the potential on the bit line is Vss. Cells which are connected to a selected word line and present in a non-selected page (bit lines are not selected) must not be written to. For this reason, the bit lines connected to these cells are also set to the voltage Vdd as in the case where data "1" is stored in PDC.

Next, the drive circuits shown in FIG. 8 apply the voltage VGD to the select line SGD of a selected block, the program voltage Vpgm (20 V) to a selected word line, and Vpass (e.g., 10 V) to non-selected word lines. When, in this state, the bit line is at Vss, the channel region of the memory cell is at Vss and the selected word line is at Vpgm, thus allowing the memory cell to be written to.

If, on the other hand, the bit line is at Vdd, no program is performed because the potential on the channel region of the memory cell is raised to a high level through coupling. Moreover, since the channel region has been charged to Vdd or VX before Vpass and Vpgm are applied to the word lines, the channel region is booted to a higher voltage. Thus, since the channel region of the cell which is not to be written to is booted to a high voltage level, erroneous writing can be prevented with certainty.

Furthermore, since the voltage applied to word lines corresponding to cells which are not to be written to is allowed to be Vpass as hitherto, it becomes possible to prevent erroneous writing to cells which are connected to a selected word line and which have the voltage on their associated bit lines set to Vss.

In the above explanation, all the bit lines are temporarily charged and the well regions are temporarily supplied with the voltage to initially charge the N$^+$ diffusion layers of the memory cell. After that, each bit line is set to a given voltage corresponding to writing or non-writing. This is not restrictive. It is also possible to set each bit line to a given voltage corresponding to writing or non-writing from the beginning.

In this case, the signal BLC1 shown in FIG. 13 is set to the voltage VSG from the beginning and the signal BLPRE is set to Vss. Assume that the bit-line voltage at the write time is set to Vss. In this state, when the well-region voltage is raised to a high level, a forward current will flow between the P-well region 55 and the N$^+$ diffusion layer connected to the bit line BL. For this reason, it is required to make the bit line floating at the write time. Alternatively, in this case, the voltage applied to the P-type well region 55 may be set to a voltage lower than the threshold voltage of a diode formed from the N$^+$ diffusion layer and the P-type well region.

(Verify Read (S14))

The verify read operation is carried out after the programming operation. First, the well region of a selected memory cell, the source line, the non-selected bit lines are set to Vss. A voltage "a'" which is a little higher than the voltage at the read time is applied to a selected word line for verification. For example, assuming that "a"=0 V, "a'"=0.5 V. In this embodiment, "'" indicates a verify voltage which is set a little higher than a voltage at the read time. The verify operation is similar to the read operation and hence its detailed description is omitted.

In the NAND flash memory, half or all of the memory cells connected to a word line are concurrently written to. If there exist cells the threshold voltages of which have not reached a given voltage as the result of the program verification, PDC in the data storage circuits corresponding to the cells holds data "0". After the program verification, a decision is made as to whether the data in PDC in all the data storage circuits has become data "1" (step S15). If there exist cells the threshold voltages of which have not reached a given voltage as the result of the decision, the programming voltage Vpgm is slightly raised and then the program operation is carried out again (step S16). Thus, the program and program verify operations are repeated with the program voltage Vpgm stepped up. When data in PDC of all the data storage circuits has become "1", the operation of writing to the first page is terminated.

The second-page write operation is fundamentally the same as the first-page write operation but different from it in a read operation (S22) to know the first-page written state, a data cache operation (S23) and a verify operation (S24 to S27) using verify levels "b", "c", and "d" in order to set writing or non-writing to the second page through data obtained by that read operation and data loaded in step S21. When there exist memory cells the threshold voltages of which are not reached as the result of the program verification, the programming operation is performed again with the programming voltage Vpgm stepped up (S28 and S29).

In the second-page write operation, as in the case of the first-page write operation, the voltage Vdd or VX is first applied to the well regions 55 and 52 to charge the $N^+$ diffusion layers of the memory cell and boot the channel region to a higher potential at the program time. Thus, erroneous writing to non-selected cells is prevented.

In this embodiment, the $N^+$ diffusion layers of the cell as the source and drain regions are charged by applying the voltage to the well regions of the cell prior to the program operation. However, in the write sequence, the program and verify read operations are performed repeatedly. For this reason, the voltage may be applied to the well regions through read recovery after data has been read from the cell. That is, it is also possible to perform the well-region voltage stepup operation in step S12 to transfer data loaded into SDC to PDC, program step S13, verify step S14, and write-voltage stepup step s16 in the first-page write operation shown in FIG. 11. Alternatively, it is also possible to perform the well-region voltage stepup operation in data cache setup step S23, program step S24, verify step S25, and write-voltage stepup step S29 in the second-page write operation shown in FIG. 12.

A technique has been developed which reads negative threshold voltages by applying a voltage to the source of the memory cell and the well regions or the substrate and raising the voltage to a higher level than the one on a selected word line to thereby apparently lead to the same case as when a negative voltage is applied to the selected word line. Thus, when a read operation is performed by applying voltages to the source of the memory cell and the well regions or the substrate, the well regions or the substrate have already been supplied with voltages. For this reason, the program operation can be performed continuously in the state where the $N^+$ diffusion layers of the memory cell have been charged. In this case, it becomes easy to hold the charged state of the $N^+$ diffusion layers by setting the source and the well regions or the substrate to Vss after the voltages on the word line and the select gate are lowered at the read recovery time. Thus, it is also possible to incorporate such a step.

In this embodiment, the cells adjacent to select gates S1 and S2 serve as dummy cells DCS and are not written with data. The reason is that the memory cells adjacent to the select gates are often poor in device characteristics due to fine structuring. Of course, it is also possible to use those memory cells as usual cells.

According to this embodiment, in writing data to memory cells, the voltage Vdd or VX is applied to well regions formed with a memory cell to raise the voltage on the $N^+$ diffusion layers of the cell and the well-region voltage is lowered to, for example, Vss prior to a word-line select operation and then the program voltage Vpgm is applied to a selected word line and the voltage Vpass is applied to non-selected word lines. For this reason, when the voltage on the word line is raised, the voltage on the channel regions of non-selected memory cells can be booted with certainty. Therefore, in storing multilevel data, erroneous writing to non-selected memory cells can be prevented without expanding the threshold voltage range.

Although, in this embodiment, the voltage Vdd or VX is temporarily applied to the well regions prior to a write operation, this is not restrictive. When memory cells are formed on a substrate, it is also possible to perform a write operation by temporarily applying the voltage Vdd or VX to the substrate.

Next, applications of the semiconductor storage device described above will be explained.

Figure 15:
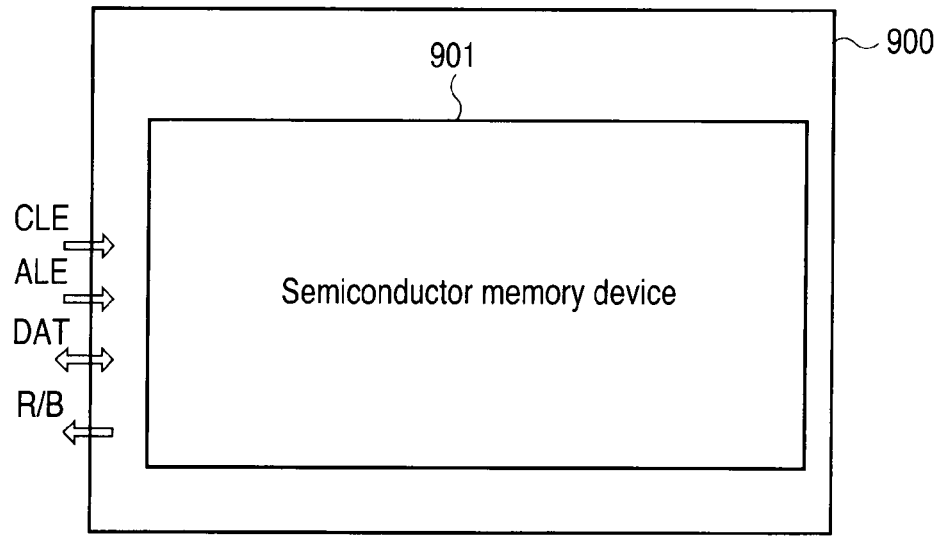
FIG. 15 a diagram showing an application to which a semiconductor memory device according to the embodiment is applied.

FIG. 15 shows a memory card to which the semiconductor storage device is applied. The memory card 900 has a semiconductor storage device 901 containing the NAND flash memory of the embodiment described above. The semiconductor storage device 901 receives or outputs predetermined control signals and data from or to an external device not shown.

That is, the semiconductor storage device 901 mounted on the memory card 900 has a signal line DAT, a command-line enable-signal line CLE, an address-line enable-signal line ALE, and a ready/busy signal line R/B connected to it. The signal line DAT transfers data, addresses, or commands. The command line enable signal line CLE indicates that a command is transferred over the signal line DAT. The ready/busy signal line R/B indicates whether the flash memory 10 is operable or not.

Figure 16:
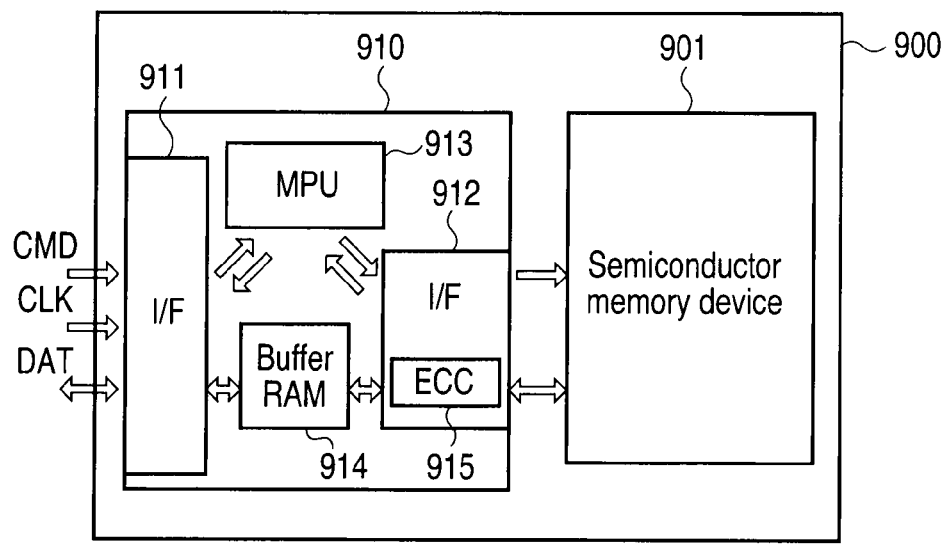

FIG. 16 shows another example of a memory card. Unlike the memory card shown in FIG. 15, this memory card has a controller 910 that controls a flash memory 3 and sends or receives signal to or from an external device not shown.

The controller 910 has an interface 911 to receive or send signals from or to the external device, an interface 912 to receive or send signals from or to the semiconductor storage device 3 containing a NAND flash memory, a microprocessor (MPU) 913 which performs operations including translation of logical addresses input from the external device into physical addresses, a RAM 914 as a buffer to store data temporarily, and an error correction unit 915 to generate error correction codes (ECC). The interface 911 of the memory card 900 has a command signal line CMD, a clock signal line CLK, and a signal line DAT connected to it.

In the memory cards, the number of signal lines, the bit width of the signal line and the configuration of the controller can be modified. The memory card can be used to constitute a solid-state drive (SSD) which substitutes for a hard disk drive.

Figure 17:
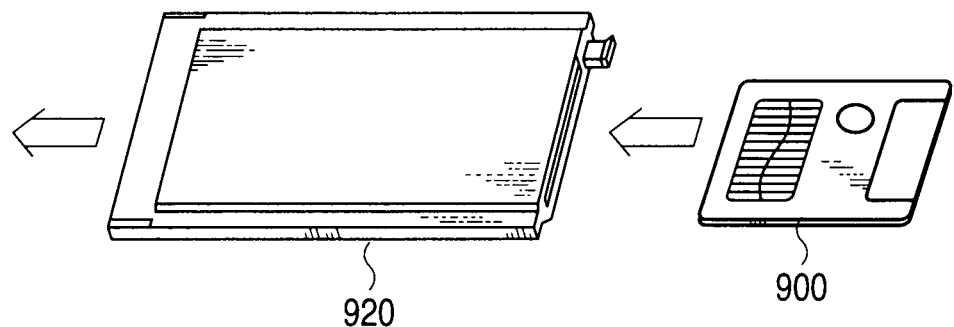

FIG. 17 shows another application. As shown, the aforementioned memory card 900 is loaded into a card holder 920 and connected to electronic equipment not shown. The card holder 920 may have part of the functions of the controller 910.

Figure 18:
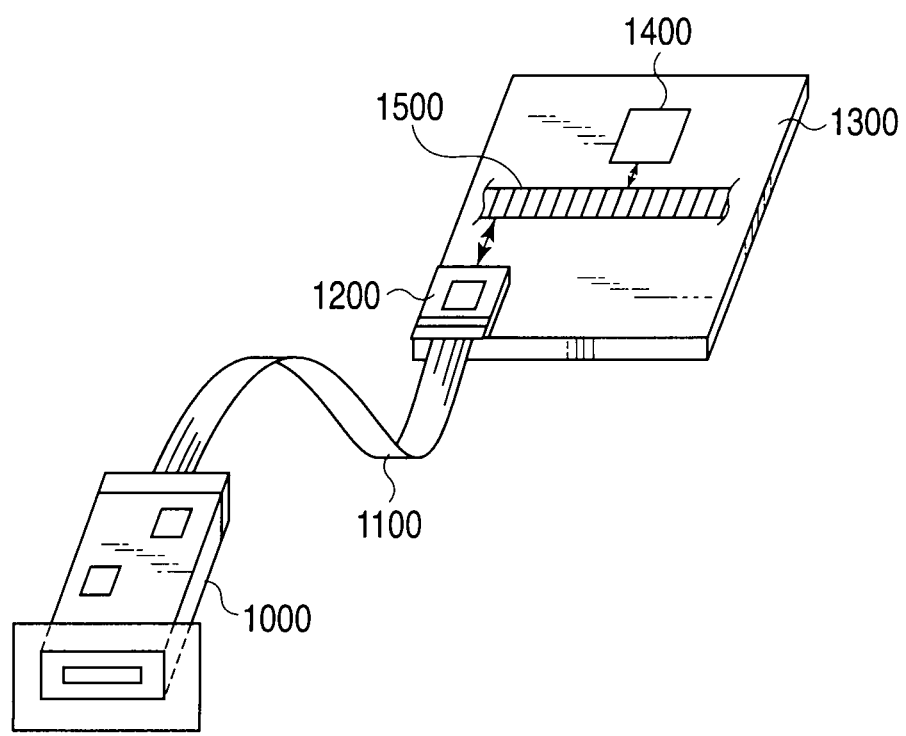

FIG. 18 shows still another application. The memory card 900 or the card holder 920 loaded with the memory card is inserted into a connection device 1000, which is connected to a board 1300 through connection wires 1100 and an interface circuit 1200. The board 1300 has a CPU 1400 and a bus 1500 mounted on it.

Figure 19:
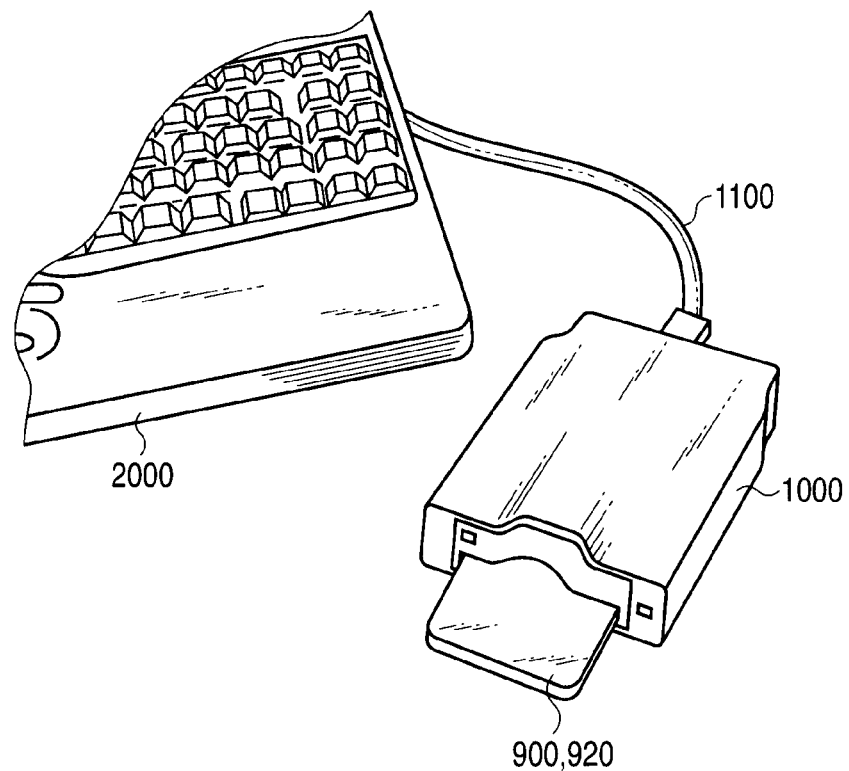

FIG. 19 shows a further application. The memory card 900 or the card holder 920 loaded with the memory card is inserted into the connection device 1000, which is connected to a personal computer 2000 through the connection wires 1100.

Figure 20:
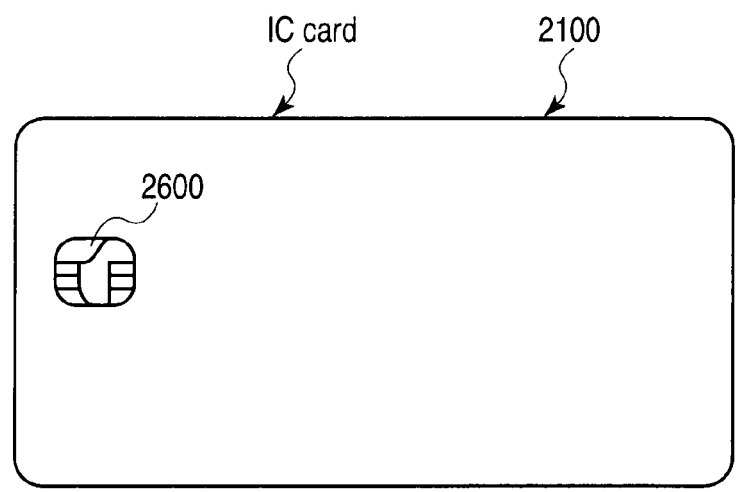
Figure 21:
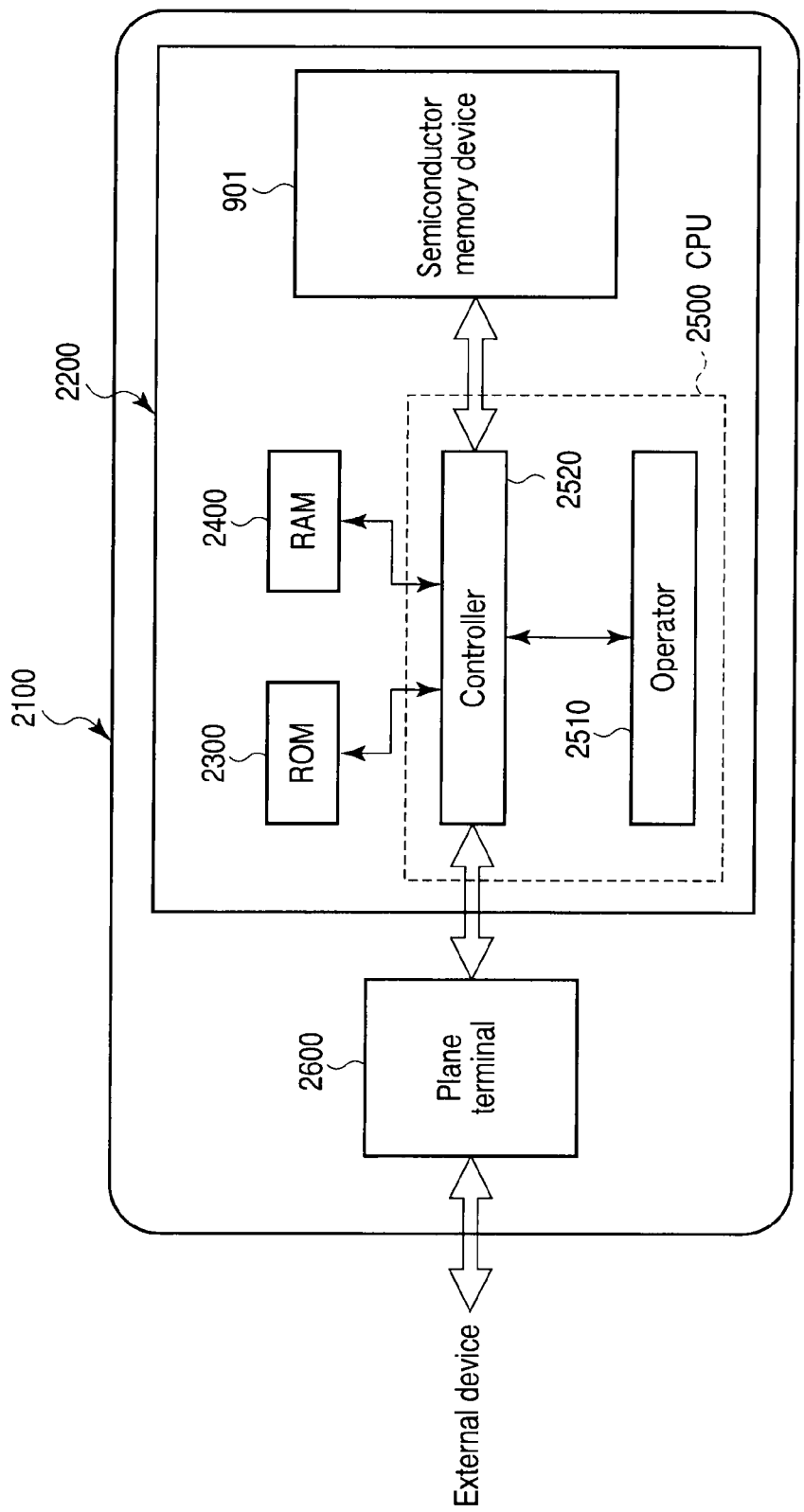

FIGS. 20 and 21 show a still further application. As shown, a smartcard (an IC card) 2100 has an MCU 2200 mounted in it. The MCU is equipped with a semiconductor storage device 901 containing a NAND flash memory according to the embodiment described above, a ROM 2300, a RAM 2400, and a CPU 2500. As shown in FIG. 20, the smartcard 2100 has an exposed plane terminal unit 2600, which is connected to the MCU 2200. The CPU 2500 includes an operations unit 2510, a flash memory 901, and a control unit 2520 connected to a ROM 2300 and a RAM 2400.

FIG. 22 shows another application as a portable music recorder/player by way of example. The portable music recorder/player 3000 has a built-in semiconductor storage device 901 containing a NAND flash memory according to the embodiment described above. Furthermore, a memory card containing a NAND flash memory can be loaded into the portable music recorder/player.

FIG. 23 shows a further application as a portable terminal device, such as a mobile phone. The portable terminal device 4000 has a built-in semiconductor storage device 901 containing a NAND flash memory according to the embodiment described above. Furthermore, a memory card 900 containing a NAND flash memory can be loaded into the portable terminal device.

FIG. 24 shows a still further application as a USB memory, for example. The USB memory 5000 has a built-in semiconductor storage device 901 containing a NAND flash memory according to the embodiment described above.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage device comprising:
   a memory cell array having a number of memory cells which are connected to word lines and bit lines, each of the memory cells configured to store one of n levels, where n is a natural number of 2 or more; and
   a control circuit configured to control the potentials on the word lines and the bit lines,
   said control circuit configured to read data from the memory cells, after supplying a first potential to a substrate or a well region in which the memory cells are disposed, and to write data to the memory cells by supplying predetermined voltage to the word line, after setting a potential of the substrate or the well region from the first potential to a second potential lower than the first potential.

2. The device according to claim 1,
   wherein each of the memory cells is connected to a bit line, the well region or substrate is supplied with the first potential when the data is written, and a third potential is supplied to the bit line.

3. The device according to claim 2,
   wherein when the second potential is supplied to the well region or substrate, a potential of the bit line is set from the third potential to a fourth potential greater than or equal to the second potential.

4. The device according to claim 2,
   wherein when the second potential is supplied to the well region or substrate, the bit line connected to each of the memory cells to which data is written is set from the third potential to a fourth potential (the fourth potential is greater than or equal to the second potential), and a potential of the bit line connected to the memory cells to which data is not written is kept to the third potential.

5. The device according to claim 1,
   wherein each of the memory cells is connected to a bit line, the bit line is connected to a data storage circuit configured to store data to be written or data not to be written, via a switch circuit, and when data is written to the memory cells, the switch circuit is turned off before the second potential is supplied to the substrate or the well region and the bit line is set to floating state.

6. The device according to claim 5,
   wherein the switch circuit is turned on state after the second potential is supplied to the substrate or the well region, and a voltage corresponding to data of the data storage circuit is supplied to the bit line.

7. The device according to claim 1, further comprising:
   a memory string to which a plurality of memory cells are connected in series; and
   a select gate transistor having a gate which is connected to a select gate line, wherein the select gate transistor is connected to one end of the memory string; and
   wherein the control circuit is configured to lower potentials of the word line and the select gate line after the data are read from the memory cells.

8. The device according to claim 7, wherein the control circuit is configured to set the potential of the well region or the substrate to zero, after lowering the potential of the word line and the select gate line.

* * * * *